(12) United States Patent  
Hoekstra et al.

(10) Patent No.: US 9,396,064 B2  
(45) Date of Patent: Jul. 19, 2016

(54) ERROR CORRECTION WITH SECONDARY MEMORY

(71) Applicants: George P. Hoekstra, Austin, TX (US); Ravindraraj Ramaraju, Round Rock, TX (US)

(72) Inventors: George P. Hoekstra, Austin, TX (US); Ravindraraj Ramaraju, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 156 days.

(21) Appl. No.: 14/266,202

(22) Filed: Apr. 30, 2014

(65) Prior Publication Data

US 2015/0318871 A1    Nov. 5, 2015

(51) Int. Cl.  
*H03M 13/29* (2006.01)  
*G06F 11/10* (2006.01)  
*H03M 13/35* (2006.01)

(52) U.S. Cl.  
CPC ........ *G06F 11/1064* (2013.01); *G06F 11/1076* (2013.01); *H03M 13/35* (2013.01)

(58) Field of Classification Search  
CPC .................................................. G06F 11/1076  
USPC .................................. 714/764, 773, 733, 718  
See application file for complete search history.

(56) References Cited

U.S. PATENT DOCUMENTS

| | | | |
|---|---|---|---|
| 5,524,231 A | 6/1996 | Brown | |
| 5,996,096 A | 11/1999 | Dell et al. | |
| 6,434,033 B1 | 8/2002 | Chien | |
| 7,562,283 B2 | 7/2009 | Falik et al. | |
| 7,624,313 B2 | 11/2009 | Wickeraad et al. | |
| 7,930,612 B2 | 4/2011 | Radke et al. | |
| 7,962,809 B1 | 6/2011 | Sutardja et al. | |
| 8,266,498 B2 | 9/2012 | Moyer | |
| 8,621,326 B2 | 12/2013 | Uchibori | |
| 2003/0217321 A1 | 11/2003 | Hsu et al. | |
| 2010/0107037 A1 | 4/2010 | Pelley, III et al. | |
| 2011/0219284 A1* | 9/2011 | Uchikawa | G06F 11/10 714/763 |
| 2011/0307769 A1 | 12/2011 | Ramaraju et al. | |
| 2012/0110411 A1 | 5/2012 | Cheung et al. | |
| 2012/0233498 A1 | 9/2012 | Ramaraju et al. | |
| 2012/0254686 A1* | 10/2012 | Esumi | H03M 13/2906 714/763 |
| 2014/0201597 A1 | 7/2014 | Hoekstra et al. | |

OTHER PUBLICATIONS

Notice of Allowance mailed Aug. 26, 2015 for U.S. Appl. No. 14/159,266, 10 pages.
Pre-Interview First Office Action mailed Jun. 29, 2015 for U.S. Appl. No. 14/159,266, 5 pages.
Wang, 'Hierarchical decoding of double error correcting codes for high speed reliable memories', Design Automation Conference (DAC), May 29-Jun. 7, 2013, pp. 1-7, Austin, TX.
Kgil, 'Improving NAND Flash Based Disk Caches', Computer Architecture, Jun. 21-25, 2008, pp. 327-338, Beijing.

(Continued)

*Primary Examiner* — Fritz Alphonse

(57) ABSTRACT

A memory system includes a memory having a plurality of address locations, each address location configured to store data and one or more error correction bits corresponding to the data. A secondary memory includes a plurality of entries, and each entry configured to store an address value of an address location of the memory and one or more error correction bits corresponding to the data stored at the address location of the memory. The error correction bits in the secondary memory can be used to correct errors in a subset of the memory having a different number of storage bits than the error correction bits in the memory.

20 Claims, 5 Drawing Sheets

(56) References Cited

OTHER PUBLICATIONS

Ankolekar, Multibit Error-Correction Methods for Latency-Constrained Flash Memory Systems, IEEE Transactions on Device and Materials Reliability, Mar. 2010, pp. 33-39, vol. 10, Issue 1.

Tanakamaru, 'Post-manufacturing, 17-times acceptable raw bit error rate enhancement, dynamic codeword transition ECC scheme for highly reliable solid-state drives, SSDs', IEEE International Memory Workshop, May 16-19, 2010, pp. 1-4, Seoul.

Chen et al, "An Adaptive-Rate Error Correction Scheme for NAND Flash Memory", 27th IEEE VLSI Test Symposium, May 3-7, 2009, pp. 53-58, Santa Cruz, CA.

\* cited by examiner

ERROR CORRECTION WITH SECONDARY MEMORY

FIELD

This disclosure relates generally to memory error correction, and more specifically, to a mechanism for extending memory used by error correction code.

BACKGROUND

As production geometries of processor systems with their associated memories decrease, the opportunities for defects in the finished products increase. These defects, along with other physical events (e.g., cosmic ray passage), can result in increasing bit error rates in system memories. Along with increasing single bit error rates are the increasing probability of double bit errors in a given area of memory.

Today's high density memories can be subject to increased incidents of bit errors than lower density memories. Process technologies used to manufacture high density memories can result in defects that cause persistent weak bits. Further, multiple neighboring bits can be subject to these defects due to processing. In addition, transient bit errors can affect multiple neighboring bits in high-density memories.

Single bit error correction methods have been used to correct occurrences of errors in a single bit of an area of memory. Single bit error correction methods, such as Hamming code methods, are attractive because they can be performed in a manner that has a minimal impact on memory latency (e.g., in a single clock cycle). But single bit error correction methods cannot correct both a transient bit error and a persistent weak bit error occurring in the same area of memory. In a circumstance where a region of memory has a double bit (or higher) error, and only single bit error correction is used, that region of memory will require reloading from a data source to correct the error. Such reloading increases memory latency due to cycles spent requesting, reading, and loading the data from the source to the region of memory.

To resolve issues related to double bit errors, polynomial code based error correction methods, such as Bose-Chaudhuri-Hocquenghem (BCH) code, can be used. These double bit error correction methods have an advantage over single bit error correction methods in that they can significantly improve memory reliability. For example, double bit error correction methods can correct both a transient bit error and a persistent weak bit error in a same area of memory. While double bit error correction methods are robust, the process of determining the location of the errors and correcting the errors are non-trivial and can result in significantly longer memory latencies than those found in single bit error correction methods. Thus, traditionally, a tradeoff has been required between memory latency and memory reliability through correction of higher numbers of bit errors.

Each word or entry in non-volatile memory has a fixed number of bits that includes a data portion and a number of spare bits for parity data. As flash memory is reprogrammed over a number of cycles, correction of higher numbers of bit errors requires more correction capability with a corresponding increase in the number of parity bits. If the number of bits allocated for parity increases, the number of bits available for storing data is reduced.

As the size of flash memory 106 grows, the size of each page in flash memory 106 can also increase. Meanwhile, sector size stays relatively fixed (either 512 Byte or 4 K Byte). In order to support the more efficient ECC of the larger pages, sectors cannot be written without updating the page ECC information. NAND flash memory 106 requires erase before programming so the sector writes cause increased wear of the bit cells due to the need to access all of the cells on the page to update the ECC information.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

DETAILED DESCRIPTION

Embodiments of the present invention provide systems and methods for using different error correction codes for different subsection sizes of a memory array. Information for the codes used for one set of subsection sizes of the memory array can be stored in the memory array in the space set aside for ECC information in the memory array. Information for the codes used for another set of subsection sizes of the memory array can be stored in a secondary memory outside the memory array. For example, ECC information appropriate to make corrections to a sector of data can be stored in the memory array and ECC information appropriate for making corrections to a page of data can be stored in the secondary memory. The type of ECC and the ECC error correction bits used for each subsection can be updated based on the number of errors detected, and/or the number of times data has been written to and read from the subsection, which is an indication of aging of the array. Different subsections can use different ECCs, and ECCs capable of correcting a greater number of bits can be used for subsections experiencing higher error rates, while ECCs suitable for correcting one or two bits in a subsection can be used for subsections experiencing lower error rates. The secondary memory can be implemented using a volatile memory device that is external to the NVM where the data is stored. The information in the secondary memory can be written and saved in the NVM device when the system is powered down and restored from the NVM device when the system is powered-up.

Figure 1:
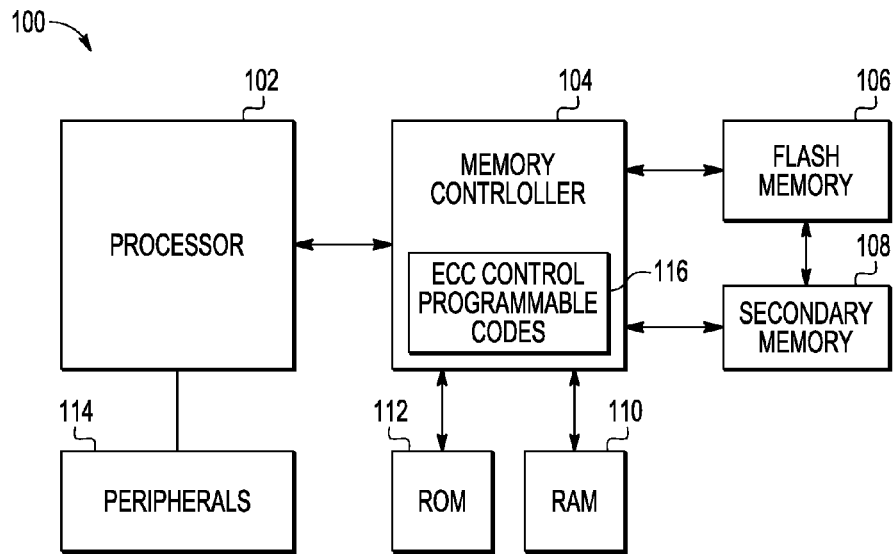
FIG. 1 illustrates a data processing system usable with embodiments of the present invention.

FIG. 1 is a simplified block diagram illustrating a data processing system 100 usable with embodiments of the present invention. Data processing system 100 includes a processor 102, a memory controller 104 with error correction code (ECC) control 116, non-volatile memory 106 such as flash memory, secondary memory 108, random access memory (RAM) 110, read-only memory (ROM) 112, and peripheral modules 114. The processor 102 is coupled to communicate with the peripheral modules 114 and memory controller 104 over one or more buses. Memory Controller 104 is coupled to communicate with flash memory 106, secondary memory 108, RAM 110 and ROM 112 via one or more buses. Secondary memory 108 can be implemented using static random access memory (SRAM), NOR flash, or other suitable non-volatile memory.

ECC control 116 can provide both error encoding and error decoding functionality. As data is received from memory (e.g., flash memory 106, RAM 110 or ROM 112) or processor 102, ECC control 116 can generate parity bits, also referred to as error correction bits, for use in subsequent error checking and correction. The mechanism for generating the parity bits is associated with the method used for decoding those parity bits during subsequent memory access and accompanying error correction and detection. For each address, both the data retrieved from memory (or generated by processor) and a fixed number of parity bits associated with the data are stored in an entry. Parity bits associated with correcting error(s) in segments of flash memory 106 of a specified size can be stored in flash memory 106 in association with their related data. Parity bits associated with correcting error(s) in segments of flash memory 106 of another specified size can be stored in secondary memory 108. For example, the parity bits in the flash memory 106 entry can be used for relatively simple error correction codes for relatively small segments of flash memory 106, such as single bit errors in sectors. When more than one or two errors are expected in the memory bits, such as after a specified number of write and/or read accesses of the array have occurred, error correction bits used in more complex ECC to correct multiple errors can be stored in secondary memory 108. The ECCs used to correct errors in the larger segments can have better efficiency and can correct burst errors in the segments than ECC used to correct errors in smaller segments of flash memory 106. The error correction bits in secondary memory 108 can also be updated as the memory cells in flash memory 106 further age due to continued write and read accesses. For example, error correction bits for the Hamming ECC can initially be stored in secondary memory 108, updated at a first specified age to error correction bits for the Reed-Solomon algorithm, and further updated at a second specified age to error correction bits for the BCH algorithm.

The number of bits in the flash memory 106, and the size and number of memory segments, can vary depending upon the implementation of system 100. The inventive concepts described herein are not limited to any particular size of memory region or memory segment. Further, embodiments of the invention are not limited solely to correction of any particular type of memory (e.g., flash memory).

Figure 2:
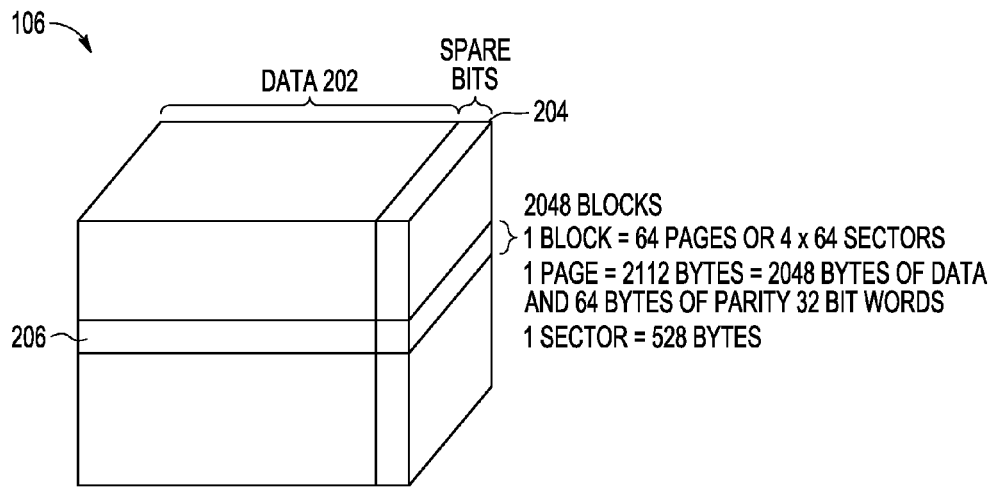
FIG. 2 illustrates an embodiment of a non-volatile memory with space for data and parity information for each entry in the non-volatile memory that can be used in the data processing system of FIG. 1.

FIG. 2 illustrates an embodiment of flash memory 106 that can be used in the data processing system of FIG. 1 including data bits portion 202 for storing data for each entry in memory 106 and spare bits portion 204 for storing parity information for each entry in memory 106. Flash memory 106 can be divided into two or more segments and sub-segments 206 such as blocks, pages, sectors, or other suitable divisions. In the example shown, flash memory 106 includes 2048 blocks. Each block can be divided into a number of pages, for example, 64 pages with each page including 2112 bytes. Alternatively, each block can be divided into a number of sectors, for example, 256 sectors with each sector including 528 bytes. As used herein, the term "segment" can refer to a page, a sector, or any other suitable division of flash memory 106.

Memory cells in flash memory 106 can be programmed and erased multiple times. As the number of program/erase cycles increases, some of the memory cells may require increased voltages during program and/or erase operations. In some cases, one or more of the cells may fail during a program or erase operation. The number of bits that fail may increase as flash memory 106 ages. In other cases, one or more transmission errors may occur when the data is sent to flash memory 106, causing one or more bits in the data to be dropped or scrambled. In these cases, an error correction code can be used to detect whether there is an error in the data, and to correct the data if there is an error. Spare bits 204 are reserved for each entry, but it is desirable to keep the number of spare bits 204 to a minimum so that more space is available to hold data in data portion 202.

Figure 3:
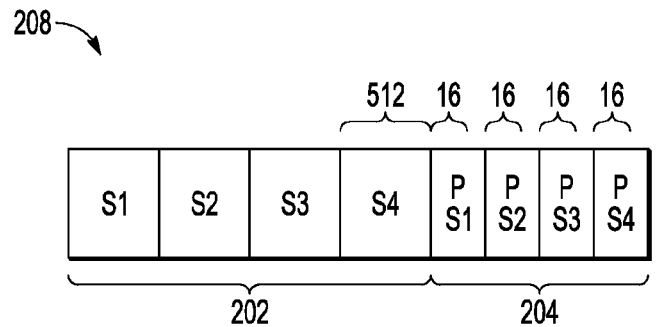
FIG. 3 illustrates an embodiment of an entry in the non-volatile memory of FIG. 2.

Some of the bits in each segment 206 are allocated to data portion 202 and the rest of the bits are allocated to spare bits portion 204. FIG. 3 illustrates an embodiment of segment 206 of flash memory 102 that includes four sectors S1-S4 in data portion 202 and 16 parity bits for each sector S1-S4 in spare bits portion 204. Each sector S1-S4 includes a number of words of data. A word can include 8, 16, 32, 64 or other suitable number of bits. A parity bit is added to a group of bits to indicate whether the number of bits in the group with a value of one or zero is even or odd. If the parity matches the actual data, then no error is detected. If the parity does not match the actual data, then an error is detected and can be corrected using correction logic in ECC control 116 (FIG. 1). In the example shown, each sector S1-S4 includes 512 bytes in data portion 202 and 16 bytes in parity portion 204. In other embodiments, each sector S1-S4 could include another suitable number of bits is data portion 202 and parity portion 204, however, it is noted that if additional space is required to use more complex error correction codes, the space allocated in data portion 202 and parity portion 204 can remain the same while the additional information for the error correction code can be stored in secondary memory 108 (FIG. 1).

Figure 4:
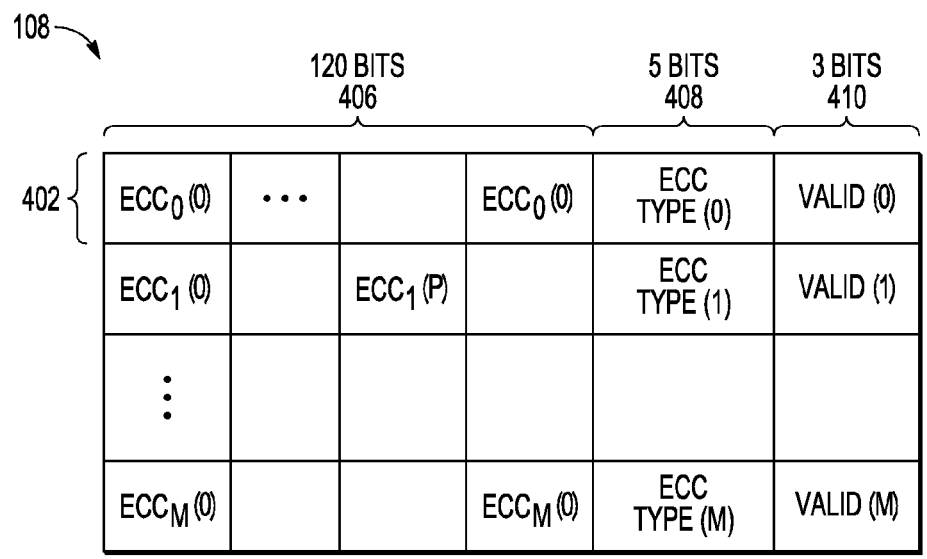
FIG. 4 illustrates an example of a secondary memory with extended error correction code information, usable to implement embodiments of the present invention.

With reference to FIGS. 1 and 4, FIG. 4 illustrates an example of secondary memory 108 with error correction code (ECC) information, usable to implement embodiments of the present invention. Secondary memory 108 includes a number of entries 402, with each entry 402 including one or more error correction bits field 406, an ECC type field 408, and an entry valid field 410. Note that entries 402 can include other fields in addition to or instead of those shown in the example. Additionally, the valid field can be combined with the type field 408 to create a control field that includes the type and the valid information. In the example shown, secondary error correction bits fields 406 includes 120 bits, ECC type field 408 includes 5 bits, and entry valid field 410 includes 3 bits, but fields 406-410 can include any suitable number of bits.

In some implementations, a number associated with a segment of flash memory 106, such as a sector or page, can be used as an index into secondary memory 108 to find the error correction information to be used for the particular segment of the memory 108. For example, the ECC information for page 0 of flash memory 102 can be found in the first entry of secondary memory 108, the ECC information for page 1 of flash memory 102 can be found in the second entry of secondary memory 108, and so on.

ECC control field 408 identifies a subset of the one or more error correction bits in error correction bits fields 406 to be used, and a type of error correction code corresponding to the subset of the error correction bits fields 406. Each subset of the secondary error correction bits fields 406 can include as many bits as required by a particular type of ECC. For example, one type of ECC may require 20 error correction bits, with another type of ECC may require only 10 error correction bits. ECC control field 408 also includes a valid indicator to indicate whether the particular entry is valid.

During a read access of flash memory 106, single bit error correction and double bit error detection (SEC-DED) can be performed on each of the memory segments. Such SEC-DED can be performed using a linear error-correcting code such as a Hamming code or other suitable ECC. SEC-DED Hamming codes can detect up to two bit errors in a segment and correct single bit errors.

If no double bit errors in any of the memory segments are detected, then the corrected data can be used to update flash memory 106 and to service the access request. For example, if no double bit errors are detected in any segment, the corrected data can be provided back to memory controller 104 to service the access request. If, however, a double bit error is detected in any of the memory segments, a determination is then made whether to reload the data from system memory such as ROM 112 or RAM 110 if the data has not been modified, or to otherwise handle the error if the data has been modified (e.g., reboot the system). The error correction bits determined by the error correction scheme chosen for the segment are placed in a corresponding entry in secondary memory 108.

Note that the scope of embodiments of the present invention is not limited to specific error correction and detection methods.

In order to perform such error correction and detection, a first set of parity bits are stored in flash memory 106 with each memory segment during error encoding. The number of parity bits depends upon the size of the memory segment and the type of error correction used. For example, for a 512 byte memory data segment, up to an additional 16 parity bytes may be available in a spare area. In some embodiments of the present invention, the parity bits for one or more alternative ECCs such as DEC-TED codes for larger segments of data can be stored in secondary memory 108, thus providing flexibility in correcting errors in different sizes of segments of flash memory 106 while retaining sufficient space in flash memory 106 to store data.

Validity field 410 can indicate the segment of flash memory 106 for which the entry is valid. For example, the validity field 410 can be set to 000 when not valid, 001 when valid for sector 1, 010 when valid for sector 2, 100 when valid for sector 3, 101 when valid for sector 4 and 111 when valid for an entire page. Other settings and other segments of flash memory 106 can be used, however.

Figure 5:
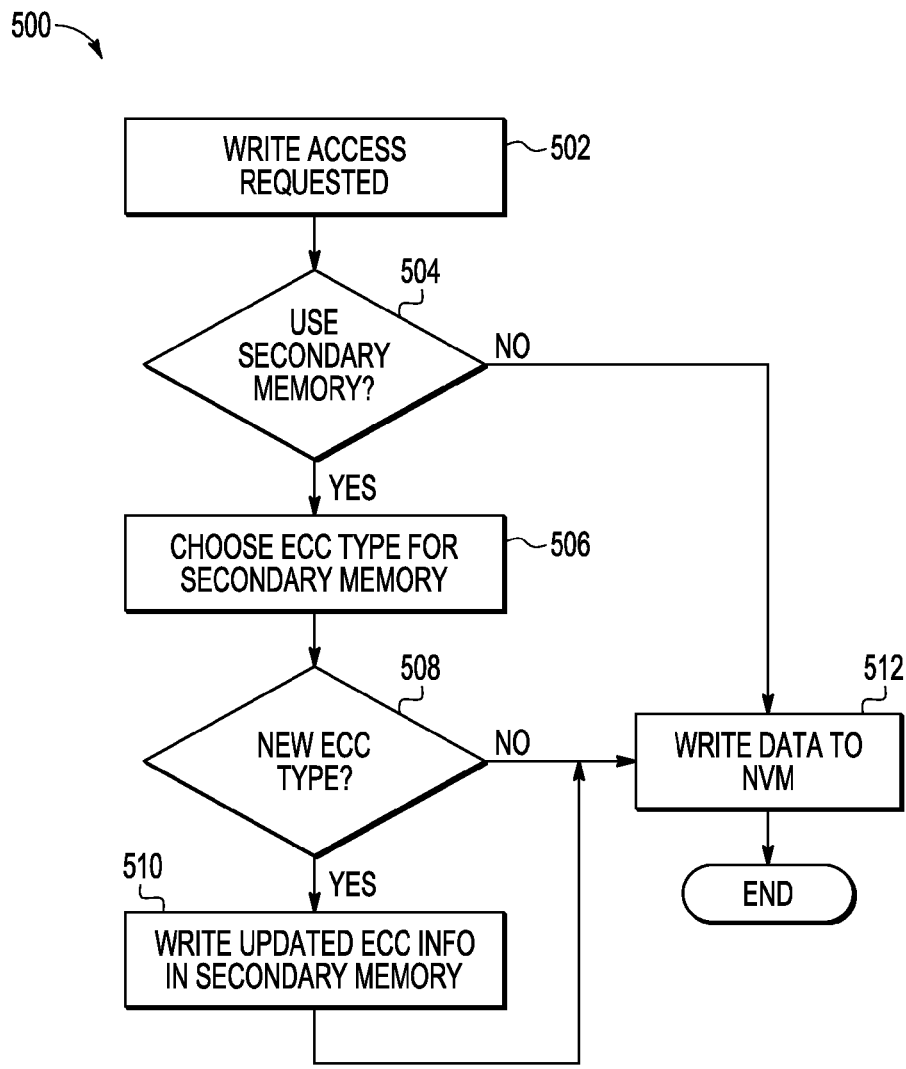
FIG. 5 illustrates an embodiment of a method for performing a write memory access using error correction code information from flash memory or secondary memory, depending on the level of errors encountered, usable in embodiments of the system of FIG. 1.

Referring to FIGS. 1 and 5, FIG. 5 illustrates an embodiment of a method 500 for performing a write memory access using error correction code information from flash memory 106 or secondary memory 108, depending on the level of errors encountered, usable in embodiments of system 100 of FIG. 1. In process 502, a message containing a memory write access address is received by memory controller 104. Process 504 determines whether error correction information from secondary memory should be used. In some embodiments, the determination is based on how many times read and/or write access has been performed on the memory cells being addressed. Other criteria for using error correction information in second memory can be used, however.

If process 504 determines error correction information from secondary memory is going to be used, process 506 chooses a type of ECC to use. For example, at a first specified age of the memory cells, the Reed-Solomon algorithm may be used. At a second specified age, a more complex ECC, such as the BCH algorithm, can be used. Other suitable criteria for choosing the type of ECC, and other types of ECC other than those mentioned, can be used.

Process 508 determines whether the type of ECC selected in process 506 has changed. If a new type of ECC is going to be used, process 510 writes the corresponding information in the error correction bits and elsewhere in a corresponding entry in secondary memory 108. Note that if the size of the segment of memory cells to be corrected using data from secondary memory 108, the address of the entry can be a number that is associated with the segment, and the number can be used to index into the secondary memory. For example, if the flash memory 106 is arranged in pages having a number of sectors, the ECC used for the sectors can be different than the ECC used for the pages. If errors in the pages are corrected using the error correction information in the secondary memory 108, the page number can be used as an index in the secondary memory 108 for the corresponding error correction entry.

Figure 6:
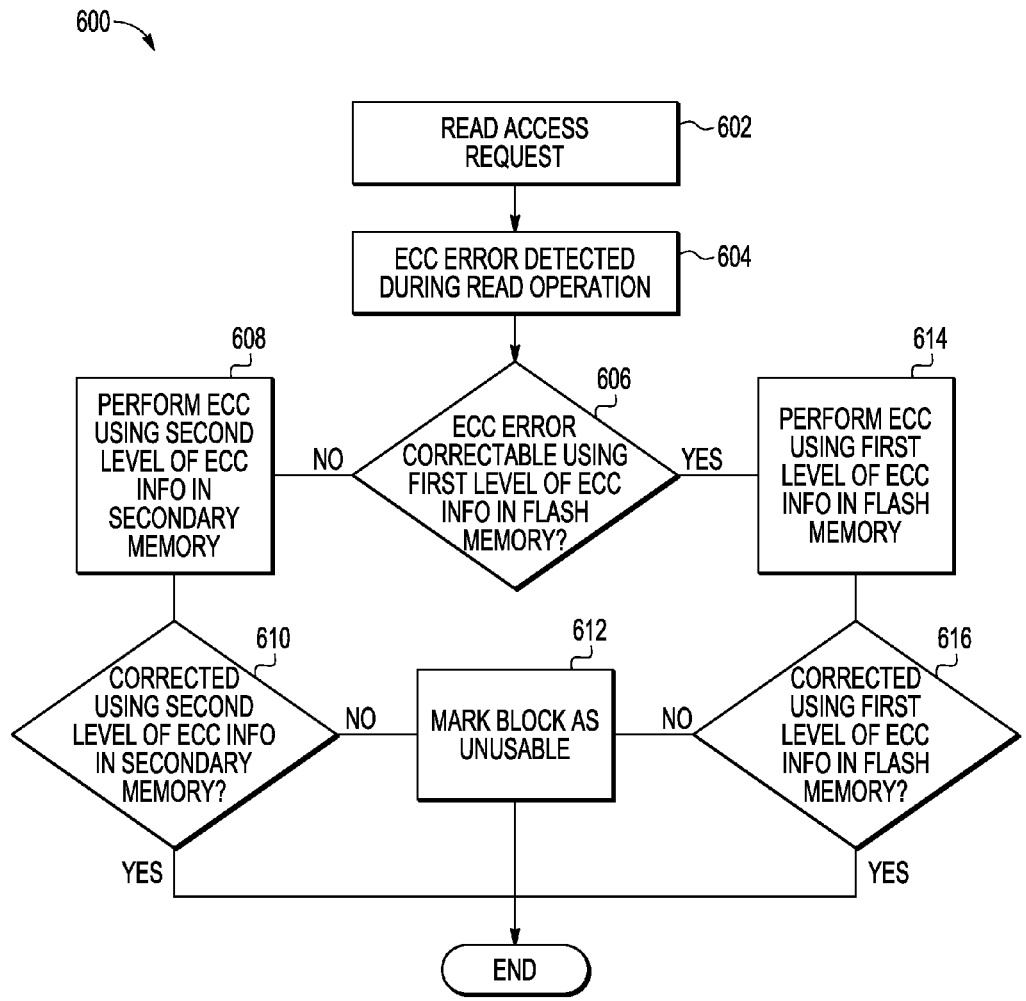
FIG. 6 illustrates an embodiment of a method for performing a read memory access using error correction code information from flash memory or secondary memory, depending on the level of errors encountered, usable in embodiments of the system of FIG.

Referring to FIGS. 1 and 6, FIG. 6 illustrates an embodiment of a method 600 for performing a read memory access using error correction code information from flash memory 106 or secondary memory 108, depending on the level of errors encountered, usable in embodiments of system 100 of FIG. 1. In process 602, a message containing a memory read access address is received by memory controller 104. Process 604 detects whether one or more errors are encountered or detected while or after performing the read operation. Process 606 determines whether the error(s) can be corrected using error correction code information in flash memory 106, for example, whether only one or two bits in flash memory 106 have errors and can be corrected with a first level of ECC with ECC information stored in flash memory 106. If process 606 determines the error(s) cannot be corrected using the first level of ECC, process 608 attempts to correct the errors using the ECC information in secondary memory 108 using a second level of ECC. The second level ECC is performed on a segment of memory that is different in size than the segment of memory on which a first level of ECC is performed. For example, the first level of ECC can be performed on a sector of memory 106 while the second level of ECC can be performed on a page of memory 106.

Process 610 determines whether the errors were successfully corrected in process 608, and if so, method 600 ends until the next read access request is received. If process 610 determines the errors could not be corrected, the block of flash memory 106 in which the errors are detected may be marked as unusable in process 612 and method 600 ends until the next read access request is received.

Referring to process 606, if the error is correctable using the ECC information in flash memory 106, process 614 attempts to correct the errors using the ECC information in flash memory 106 using a first level of ECC on a segment of memory that can be different in size than the segment of memory on which a second level of ECC is performed. For example, the first level of ECC can be performed on a sector of memory 106 while the second level of ECC can be performed on a page of memory 106.

Process 616 determines whether the errors were successfully corrected in process 614, and if so, method 600 ends until the next read access request is received. If process 616 determines the errors could not be corrected, the block of flash memory 106 in which the errors are detected may be marked as unusable in process 612 and method 600 ends until the next read access request is received.

Figure 7:
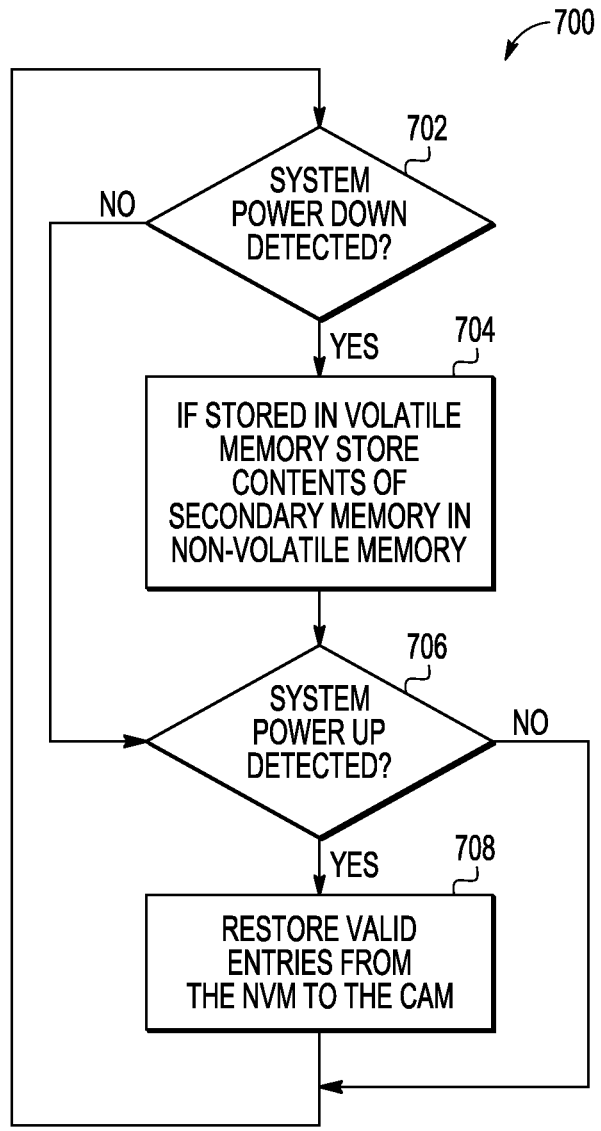
FIG. 7 illustrates an embodiment of a method for saving and restoring entries in CAM during power down and power up modes, usable in embodiments of the system of FIG. 1.

FIG. 7 illustrates an embodiment of a method 700 for saving and restoring entries 402 (FIG. 4) in secondary memory 108, usable in embodiments of the system of FIG. 1. Process 702 determines whether a system power down has been detected. If a power down is detected, process 704 includes storing the contents of secondary memory 108 in non-volatile memory, such as flash memory 106 or other suitable non-volatile memory in system 100. If no power down is detected, or process 704 is complete, method 700 transitions to process 706, which includes detecting whether a system power up is detected. If a power up is detected, process 708 restores valid entries from the non-volatile memory to secondary memory 108. If a power up is not detected in process 706 or power up is detected and process 708 is complete, method 700 transitions to process 702. Method 700 may only need to be performed when secondary memory 108 is a volatile type of memory that erases data when power is not available.

By now it should be appreciated that in some embodiments, there has been provided that maintains a separate secondary memory 108 with addresses that index each page of flash memory 106. The secondary memory 108 includes ECC information for the page while the flash memory includes ECC information for the sector. If there are errors at the sector level, the ECC information in the flash memory is used to correct errors in the sector. If the ECC information in the flash memory 106 does not correct the errors, the ECC information in the secondary memory 108 is used, and the corrections are made on a page. Different codes could be employed using ECC information in the secondary memory 108, enabling more powerful codes to be employed as the memory wears out.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 100 are implemented with circuitry located on a single integrated circuit or within a same device. Alternatively, the systems and subsystems may include any number of separate integrated circuits or separate devices interconnected with each other. For example, RAM 110, ROM 112, secondary memory 108 and flash memory 106 may be located on a same integrated circuit as processor 102 or on a separate integrated circuit or located within another peripheral or slave discretely separate from other elements of system 100. Peripheral modules 114 may also be located on separate integrated circuits or devices. Also for example, system 100 or portions thereof may be soft or code representations of physical circuitry or of logical representations convertible into physical circuitry. As such, the systems may be embodied in a hardware description language of any appropriate type.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the above-discussed embodiments can be implemented by software modules that perform one or more tasks associated with the embodiments. The software modules described herein may be received elements by data processing system 100, for example, from computer-readable storage media such as flash memory 106, secondary memory 108, RAM 110 and ROM 112 respectively, or other media on other computer systems. Such computer-readable storage media may be permanently, removably or remotely coupled to a data processing system. The computer-readable storage media may include non-transitory computer readable storage media, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, and the like. Other new and various types of non-transitory computer-readable storage media may be used to store the modules discussed herein. Non-transitory computer-readable storage media include all computer-readable media except for a transitory, propagating signal.

In one embodiment, data processing system 100 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, tablets, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

The term "bus" is used to refer to a plurality of signals or conductors which may be used to transfer one or more various types of information, such as data, addresses, control, or status. The conductors may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory system comprising:
    a memory having a plurality of address locations, each address location configured to store data and one or more error correction bits corresponding to the data; and
    a secondary memory, wherein the secondary memory includes a plurality of entries, each entry configured to store one or more error correction bits corresponding to the data stored at an address location of the memory, the error correction bits in the secondary memory being used to correct a different number of storage bits in the memory than the error correction bits in the memory.

2. The memory system of claim 1, wherein each entry of the secondary memory is further configured to store an error correction control value that identifies a type of error correction code to use to correct errors in the corresponding subset of the memory.

3. The memory system of claim 1, wherein the error correction bits in the secondary memory are used to correct errors in a subset of the memory after a specified number of write operations and/or read operations are performed on memory cells in the subset of the memory.

4. The memory system of claim 1, wherein different error correction bits are used for different subsets of the data.

5. The memory system of claim 1, wherein the error correction bits in the secondary memory are changed from first values to second values when a specified criteria for memory cells in the subset of the memory is met, wherein the criteria includes one of a group consisting of: a greater number of errors are found after writing the data than were found during a previous write operation, and a specified number of write operations and/or read operations are performed on memory cells in the subset of the data.

6. The memory system of claim 1, further comprising:
    a memory controller coupled to the memory and to the secondary memory, wherein the memory controller, in response to a read access to a first address location of the memory, is configured to:
        determine if a first level of ECC is to be used for the first address location of the memory;
        if the first level of ECC is not to be used for the first address location, using the one or more error correction bits stored in the secondary memory to determine if an error is present in the data stored at the first address location; and
        if the first level of ECC is to be used for the first address location, using the one or more error correction bits stored in the memory to determine if an error is present in the data stored at the first address location.

7. The memory system of claim 6, wherein the memory controller, in response to the read access, is further configured to:
    marking a block containing the first address location as unusable if the error was not corrected using the error correction bits from the second memory.

8. The memory system of claim 6, wherein the memory controller, in response to a write access to a second address location of the memory with corresponding write data, is configured to:
    store the write data to the second address location;
    determine if a second level of ECC is to be used for the second address location of the memory; and if the second level of ECC is to be used for the second address location, choosing a type of ECC for the secondary memory.

9. The memory system of claim 8, wherein the memory controller, in response to the write access, is further configured to:
if the second level of ECC is to be used for the second address location, updating ECC information in the secondary memory if a new type of ECC is chosen.

10. The memory system of claim 8, wherein the memory controller, in response to the write access, is further configured to:
if the second level of ECC is to be used for the first address location, generating one or more error correction bits for the write data based on the type of ECC chosen, and storing the generated one or more error correction bits to the secondary memory.

11. The memory system of claim 1, wherein the subset of the memory corresponds to one of a page and a block of the memory and the error correction bits in the memory are used to correct errors in a sector of the memory.

12. The memory system of claim 1, wherein the error correction bits in the memory are used to correct an error in a subset of the memory that is smaller than a page of the memory and the error correction bits in the secondary memory are used to correct one or more errors in a subset that is at least as large as a page of the memory.

13. The memory system of claim 12, wherein the memory is characterized as a nonvolatile memory and the secondary memory as a random access memory (RAM).

14. The memory system of claim 1, wherein the memory controller is configured to:
in response to a power down request, store valid entries of the secondary memory to the memory; and
in response to a power up request, restore the valid entries from the memory to the secondary memory.

15. In a memory system, a method comprising:
receiving a request to access to a first address location of a memory, wherein the first address location of the memory stores data and one or more corresponding error correction bits;
in response to the access request:
determining if error correction bits in a secondary memory are to be used to correct errors in the data, wherein the error correction bits in the secondary memory are used to correct a different number of bits in the memory than the error correction bits in the memory;
if the error correction bits in the secondary memory are to be used to correct errors in the data, using the error correction bits stored in the secondary memory to determine if an error is present in at least a portion of the data stored in the memory.

16. The method of claim 15, further comprising, in response to the access request:
if the error correction bits in the secondary memory are to be used to correct errors in the data, using a page number containing the data to be corrected as an index to a location of the error correction bits in the secondary memory.

17. The method of claim 15, further comprising:
determining to use the error correction bits in the secondary memory to correct errors in the at least a portion of the data after a specified number of accesses are performed on memory cells in the at least a portion of the data; and
changing the error correction bits in the secondary memory from first values to second values when a specified criteria for memory cells in at least a portion of the data is met, wherein the criteria includes one of a group consisting of: a greater number of errors are found after writing the data than were found during a previous write operation, and another specified number of write operations and/or read operations are performed on memory cells in the at least a portion of the data.

18. A memory system comprising:
a nonvolatile memory having a plurality of address locations, each address location configured to store data and one or more error correction bits corresponding to the data;
a secondary memory, wherein the secondary memory includes a plurality of entries, each entry configured to store an address value of an address location of the memory and one or more error correction bits corresponding to the data stored at the address location of the memory; and
a memory controller coupled to the memory and the secondary memory, wherein the memory controller is configured to:
use a number associated with a size of a respective subsection of the memory to index into the secondary memory;
determine if the error correction bits in the secondary memory are to be used to correct errors in the data; and
if the error correction bits in the secondary memory are to be used to correct errors in the data, use the one or more error correction bits stored at the address location of the memory to determine if an error is present in the data stored at the address location, wherein the amount of data for which errors are corrected using the error correction bits in the secondary memory is different than the amount of data for which errors are corrected using the error correction bits in the nonvolatile memory.

19. The memory system of claim 18, wherein it is determined to use the error correction bits in the secondary memory to correct errors in a subset of the data after a specified number of write operations and/or read operations are performed on memory cells in the subset of the data.

20. The memory system of claim 18, wherein the error correction bits in the secondary memory are changed from first values to second values when a specified criteria for memory cells in a subset of the data is met, wherein the criteria includes one of a group consisting of: a greater number of errors are found after writing the data than were found during a previous write operation, and a specified number of write operations and/or read operations are performed on memory cells in the subset of the data.

* * * * *